(12) United States Patent
Ramlall et al.

(10) Patent No.: US 9,438,277 B2
(45) Date of Patent: Sep. 6, 2016

(54) INTERMEDIATE FREQUENCY SPECTRAL PLACEMENT OF BANDPASS SAMPLED SIGNALS

(71) Applicants: Sunil Ramlall, San Diego, CA (US); Rohan Ramlall, San Diego, CA (US)

(72) Inventors: Sunil Ramlall, San Diego, CA (US); Rohan Ramlall, San Diego, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/452,042

(22) Filed: Aug. 5, 2014

(65) Prior Publication Data
US 2016/0043749 A1 Feb. 11, 2016

(51) Int. Cl.
*H04L 27/06* (2006.01)
*H04B 1/00* (2006.01)
(Continued)

(52) U.S. Cl.
CPC .......... *H04B 1/0007* (2013.01); *H03M 1/1255* (2013.01); *H04L 5/001* (2013.01)

(58) Field of Classification Search
CPC ............................ G01S 7/003; G01S 7/52085
See application file for complete search history.

(56) References Cited

U.S. PATENT DOCUMENTS 6,243,430 B1 * 6/2001 Mathe ............... H03M 3/344
375/346
8,676,147 B1 * 3/2014 Curry ................ H04L 7/007
370/286

(Continued)

OTHER PUBLICATIONS

Vaughn, R. et al. "The Theory of Bandpass Sampling," IEEE Trans. Signal Processing, vol. 39, No. 9, pp. 1973-1984, Sep. 1991.
(Continued)

*Primary Examiner* — Shuwang Liu
*Assistant Examiner* — Gina McKie
(74) *Attorney, Agent, or Firm* — SSC Pacific Patent Office; Arthur K. Samora; Kyle Eppele

(57) ABSTRACT

Systems and methods for bandpass sampling of a continuous analog signal according to several embodiments can use a linear relationship between sampling frequency and intermediate frequency $$f_{IF} = (-1)^{n+1}\left(-\left\lfloor\frac{n}{2}\right\rfloor F_S + f_C\right)$$

where $f_{IF}$ is the intermediate frequency and $F_S$ is the sampling frequency of the bandpass sampling, $f_C$ is the carrier frequency, B is a bandwidth and $f_U$ is an upper frequency for the signal, and n is an integer such that $$1 \le n \le \left\lfloor\frac{f_U}{B}\right\rfloor.$$

The sampling frequency $F_S$ can be chosen first and the IF can be calculated without iteration using the relationship above. Or, when $f_{IF}$ is the most important design parameter, $f_{IF}$ can be selected first, and sample frequencies which will not cause aliasing can be solved by calculating $F_S$ given IF using the equation above, for all values of n so that $$1 \le n \le \left\lfloor\frac{f_U}{B}\right\rfloor,$$

and then selecting a particular $F_S$. $f_{IF}$ can be chosen to be $F_S/4$.

4 Claims, 5 Drawing Sheets

(51) Int. Cl.
H03M 1/12 (2006.01)
H04L 5/00 (2006.01)

(56) References Cited

U.S. PATENT DOCUMENTS

2007/0081578 A1* 4/2007 Fudge ................. H04B 1/0003
375/130
2007/0217560 A1* 9/2007 Kim ..................... H04B 1/0003
375/355

OTHER PUBLICATIONS

Qing, X. et al., "A Digital Intermediate Frequency Receiver for Intervehicle Communications," Proc. of IEEE Intelligent Vehicles Symp., pp. 840-845, Jun. 13-15, 2007.
Harris, et al., "Polyphase Analysis Filter Bank Down-Converts Unequal Channel Bandwidths With Arbitrary Center Frequencies", Analog Inegrated Circtuis and Signal Procesing vol. 71, No. 3, pp. 484-494, Jun. 2012.
Tseng, C. et al., "Direct down conversion of multiband RF signals using bandpass sampling," IEEE Trans. Wireless Communications, vol. 5, No. 1, pp. 72-76, Jan. 2006.
Akyildiz, I. et al., "The Evolution to 4G Cellular Systems: LTE Advanced," Physical Communication, vol. 3, No. 4, pp. 217-244, Dec. 2010.
Akos, D. et al., "Direct Bandpass Sampling of Multiple Distinct RF Signals," IEEE Trans. Communications, vol. 47, No. 7, pp. 983-988, Jul. 1999.
Ramlall, S. et al., "On the IF Spectral Placement of Bandpass Sampled Signals", IEEE Signal Processing Society 15th DSP Workshop & 7th SPE Workshop, Aug. 11-14, 2013.
Wong, N. et al., "An Efficient Algorithm for Downconverting Multiple Bandpass Signals Using Bandpass Sampling", IEEE 0-7803-7097-1/01, Jan. 2001.

* cited by examiner

Graph of (3) and (16) when $f_c$=100 MHz and B=20 MHz

INTERMEDIATE FREQUENCY SPECTRAL PLACEMENT OF BANDPASS SAMPLED SIGNALS

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing NC 102470.

FIELD OF THE INVENTION

The present invention pertains generally to methods for designing radios. More specifically, the present invention according to several embodiments covers a computationally efficient procedure for designing radios that use bandpass sampling to accomplish analog to digital conversion of signals. The present invention is particularly, but not exclusively, useful for designing radios that accomplish bandpass sampling using a linear relationship between intermediate frequency and sampling frequency design parameters, in order to simplify the radio design process.

BACKGROUND OF THE INVENTION

An analog signal is continuous in time, and it can often be necessary to convert the analog signal to a flow of digital values (i.e, a digital signal), which can typically be further processed more easily than the original analog signal. An analog to digital converter (ADC) can be used to accomplish this conversion. An ADC can operate by sampling the value of the input at discrete intervals in time. Provided that the input is sampled at a rate above the Nyquist rate (defined as twice the highest frequency component of the signal), then the digital signal is an accurate representation of the analog signal, and the analog signal can be reconstructed from the digital signal.

However, if the signal is sampled at a rate less than the Nyquist rate, the signal can be incorrectly converted to a signal that is not really representative of the original analog signal. This is commonly referred to as aliasing. Aliasing can occur because instantaneously sampling a function at two or fewer times per cycle can result in missed cycles, and therefore the appearance of an incorrect lower converted frequency. For example, a 2 kHz sine wave being sampled at 1.5 kHz could be reconstructed as a 500 Hz sine wave. It is therefore important to define the rate at which new digital values can be sampled from the analog signal. The rate at which new values are sampled can be called the sampling rate or sampling frequency of the converter.

Bandpass sampling is a widely used approach to sample a continuous-time bandpass signal, and in so doing, down-convert the signal to a lower intermediate frequency (IF). When used in software-defined radios (SDR), bandpass sampling can allow the ADC to be placed closer to the antenna and can eliminate the need for certain analog circuitry components such as mixers, along with their associated nonlinear characteristics. To take advantage of these attributes, however, an appropriate designed IF and sampling frequency must be selected.

Selecting the "right" sampling frequency ($F_S$) and intermediate frequency (IF or $f_{IF}$) can be hard to do, because to date, only a nonlinear relationship between the intermediate frequency (IF) and sampling frequency (or rate) has been presented when bandpass sampling is used. Cognitive radios (CR) and SDR's have the ability to vary the sampling rate used by their ADC, which changes the IF; but due to the nonlinearity of the aforementioned relationship, it can be challenging (and computationally intensive) to first choose a desired IF and then select the corresponding sampling rate without delving into an iterative, inefficient process.

In view of the above, it is an object of the present invention to provide a bandpass sampling method and device employing such design methods, which use a linear relationship between sampling frequency and IF. Another object of the present invention is to provide a bandpass sampling method and devices that can be used in place of the previously known nonlinear one, and which can find a sampling frequency without iteration in applications where the IF is important. Still another object of the present invention is to provide a bandpass sampling method and device wherein IF is chosen first as the primary design parameter and sampling is then chosen in a deterministic manner, without iteration. Yet another object of the present invention is to provide a bandpass sampling method and devices, which can reduce the complexity of the receiver. Another object of the present invention is to provide a bandpass sampling method and devices, which allow for more efficient allocation of bandwidth resources when multiple signals are being bandpass sampled. Yet another object of the present invention is to provide a bandpass sampling method and devices, which allows for more efficient carrier aggregation. Still another object of the present invention to provide a bandpass sampling method and devices, which can be easy to implement and deploy in a cost-efficient manner.

SUMMARY OF THE INVENTION

The methods for bandpass sampling of a continuous analog signal using a linear relationship between sampling frequency and intermediate frequency, and devices accomplishing such methods (such as analog to digital converters, ADC's, by way of non-limiting example) according to several embodiments can use the linear relationship $$f_{IF} = (-1)^{n+1}\left(-\left\lfloor\frac{n}{2}\right\rfloor F_S + f_C\right)$$

where $f_{IF}$ is the intermediate frequency, $F_S$ is the sampling frequency, $f_C$ is the carrier frequency for the signal and n is an integer such that $$1 \le n \le \left\lfloor\frac{f_U}{B}\right\rfloor,$$

where B is the bandwidth and $f_U$ is the upper frequency (i.e., highest frequency component) of the signal and $\lfloor\ \rfloor$ denotes the mathematical floor function. In cases where there is one signal at a single carrier frequency, the sampling frequency Fs can be chosen first and the IF can be calculated without iteration using the relationship above. Or, in instances where IF is deemed an important design parameter, the IF can be selected first, and sampling frequencies which will not cause aliasing can be solved by calculating $F_S$ given IF using the equation above for all values of n so that $$1 \le n \le \left\lfloor \frac{f_U}{B} \right\rfloor,$$

and then selecting a particular $F_S$. In some embodiments, the IF can be chosen to be $F_S/4$. In cases where there are multiple signals at multiple carrier frequencies, the above linear relationship can be used to select a particular $F_S$ that simplifies processing when used along with a polyphase downconverter channelizer.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

1. Prior Art Bandpass Sampling Relationships

In the prior art, for a real, continuous-time bandpass signal x(t) with carrier frequency $f_C$ and bandwidth B (i.e. X(f) is only nonzero on the intervals ($-f_C-B/2, -f_C+B/2$) and ($f_C-B/2, f_C+B/2$)), the valid sampling frequencies that will not result in aliasing can be given by:

$$\frac{2f_U}{n} \le F_S \le \frac{2f_L}{n-1} \quad \text{Eq. (1)}$$

where $f_L = f_C - B/2$, $f_U = f_C + B/2$, and n is an integer such that $$1 \le n \le \left\lfloor \frac{f_U}{B} \right\rfloor \quad \text{Eq. (2)}$$

Instead of using the above equations, alternative equations in the prior art have been presented for finding valid sampling frequencies that included determining the IF. For example, the IF of the sampled signal in the prior art can be given by:

$$f_{IF} = \begin{cases} rem(f_C, F_S) & \left\lfloor \frac{f_C}{\frac{F_S}{2}} \right\rfloor \text{ even} \\ F_S - rem(f_C, F_S) & \left\lfloor \frac{f_C}{\frac{F_S}{2}} \right\rfloor \text{ odd} \end{cases} \quad \text{Eq. (3)}$$

where rem is the remainder after division. According to Eq. (3), the IF is a nonlinear function of the sampling frequency. To make use of Eq. (3), the person of skill in the relevant art could: 1) Use Eq. (1) to select a valid sampling frequency $F_S$; and, 2) Use Eq. (3) to determine the IF. Note that due to the nonlinearity of Eq. (3), $F_S$ needs to be selected first and then the IF can be calculated. The opposite order would be challenging to do, i.e. selecting the IF first and then calculating $F_S$. Thus, Eq. (3) can be difficult to use in applications where the IF is an important design parameter.

2. Derivation of Linear Relationship Between IF and $F_S$

In order to derive a linear relationship between the IF and sampling frequency, it can be necessary to briefly review some of the basics of sampling theory. Using the aforementioned assumption that x(t) is a real, continuous-time bandpass signal with carrier frequency $f_C$ and bandwidth B, sampling x(t) at a sampling frequency $F_S$ can be equivalent to multiplying x(t) by a continuous-time impulse train with period $T=1/F_S$ and passing the resulting signal through an ideal lowpass filter with cutoff frequency $F_S/2$. Since multiplication in the time domain is equivalent to convolution in the frequency domain, images of X(f) are centered at integer multiples of $F_S$ (since the Fourier transform of an impulse train with period T is also an impulse train with impulses at $kF_S$ where $k=0, \pm 1, \pm 2, \ldots$ ).

Figure 1A:
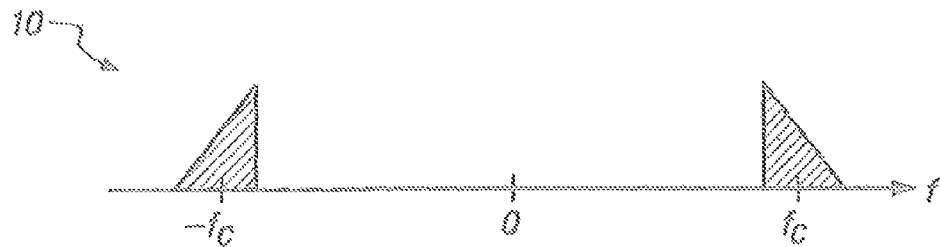
FIG. 1A is a prior art graph in the X(f) frequency domain of intermediate frequency (IF) versus sampling frequency ($F_S$) for the original spectrum of a representative signal.
Figure 1B:
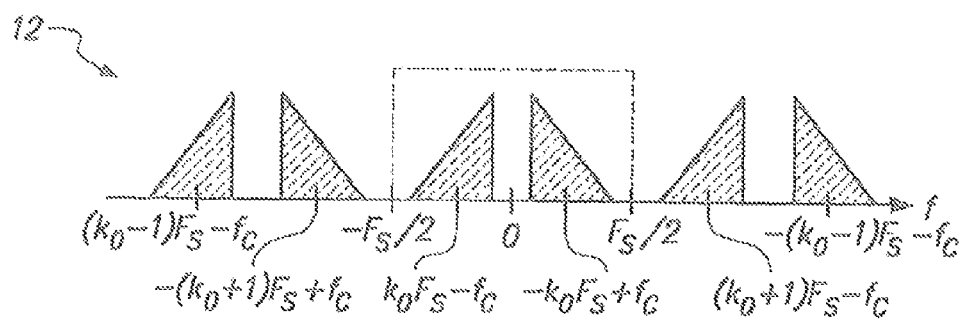
FIG. 1B is a prior art graph in the X(f) frequency domain of within the first Nyquist zone ($\pm F_S/2$) of intermediate frequency (IF) versus sampling frequency ($F_S$) for a normal spectral placement.
Figure 1C:
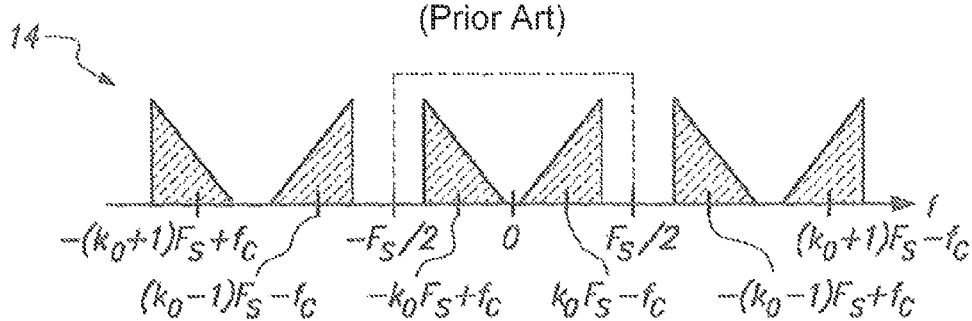
FIG. 1C is a prior art graph in the X(f) frequency domain of within the first Nyquist zone ($\pm F_S/2$) of intermediate frequency (IF) versus sampling frequency ($F_S$) for an inverted spectral placement.

Assume also that $F_S$ is chosen such that it satisfies Eq. (1). This assumption applies for the rest of the derivation. Then, the IF signal is the image of the positive and negative spectrums of X(f) that fall within the first Nyquist zone ($\pm F_S/2$). This is shown in graphs 10, 12 and 14 of FIGS. 1A, 1B and 1C, respectively, which can represent the original spectrum, the normal spectral placement and the inverted spectral placement, respectively, of X(f). The graphical representations can be expressed quantitatively as the IF signal is the $k_0$ image of the positive and negative spectrums of X(f) that satisfies the following:

$$k_0 = \min_{k \in \mathbb{N}_0} k \text{ s.t. } kF_S - f_C \ge -\frac{F_S}{2} \quad \text{Eq. (4)}$$

where $\mathbb{N}_0$ denotes the set of nonnegative integers. The resulting IF can be given by the following:

$$f_{IF} = \begin{cases} -k_0 F_S + f_C & n \text{ odd} \\ k_0 F_S - f_C & n \text{ even} \end{cases} \quad \text{Eq. (5)}$$

For the IF and sampling frequency to be linearly related, $k_0$ needs to be deterministic, which will now be proved, i.e., Eq. (4) needs to be solved. To solve Eq. (4), the constraint k in Eq. (4) can be rewritten as $$k \geq \frac{f_C}{F_S} - \frac{1}{2} \quad \text{Eq. (6)}$$

For a fixed value of n, the smallest and largest values of $F_S$ in Eq. (6) can be given by Eq. (1). Substituting these two values of $F_S$ into Eq. (6) produces two equations for the lower bound of k. These two lower bounds are evaluated in the following subsections.

2.1. Smallest Lower Bound for k in Equation Eq. (6)

The smallest the right-hand side (RHS) of Eq. (6) can be is when the largest value of $F_S$ from Eq. (1) is substituted into Eq. (6). Eq. (6) can then be simplified to $$k \geq \frac{n - 2 + \frac{B}{2f_C}}{2 - \frac{B}{f_C}} \quad \text{Eq. (7)}$$

In general, the bandwidth to carrier frequency ratio $B/f_C$ of a bandpass signal is greater than 0. Also note that since n is fixed, there is another implicit constraint imposed on $B/f_C$ from Eq. (2). More specifically, the possible values of $B/f_C$ can be $$0 < \frac{B}{f_C} \leq \frac{1}{n - \frac{1}{2}} \quad \text{Eq. (8)}$$

Looking at Eq. (7), the RHS is smallest when $B/f_C = \epsilon$, where $\epsilon$ is a very small positive number close to 0. Substituting this into Eq. (7) results in $$k \geq \frac{n - 2 + \frac{\varepsilon}{2}}{2 - \varepsilon} \quad \text{Eq. (9)}$$

The RHS of Eq. (7) is largest when $B/f_C$ is largest. Equation Eq. (7) then becomes $$k \geq \frac{n^2 - \frac{5}{2}n + \frac{3}{2}}{2n - 2} \quad \text{Eq. (10)}$$

Figure 2:
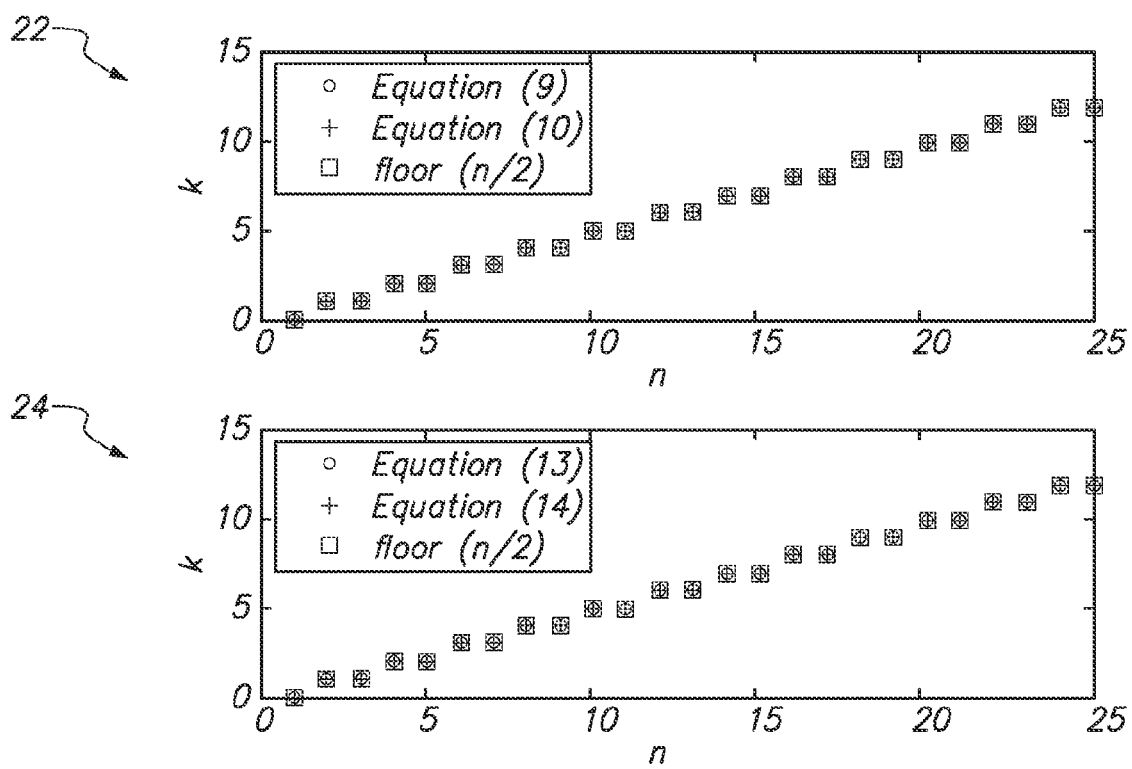
FIG. 2 is a graphs k versus n, which is used to demonstrate the proof of the linear relationship between IF and $F_S$ for the systems and methods of the present invention.

Referring now to FIG. 2, the top graph 22 of FIG. 2 illustrates the smallest integer value of k that satisfies Eq. (10). As seen in the figure, the smallest integer values of k that satisfy Eq. (9) and Eq. (10) are both equivalent to $\lfloor n/2 \rfloor$.

This can also be verified by substituting $k=n/2$ for n even and $k=(n-1)/2$ for n odd into Eq. (9) and Eq. (10) and seeing that both inequalities can be still satisfied, while $k=(n-2)/2$ and $k=(n-3)/2$ do not satisfy them. Thus, the smallest integer value of k that satisfies Eq. (7) is the same for all values of $B/f_C$ in Eq. (8), and Eq. (7) simplifies to $$k > \left\lfloor \frac{n}{2} \right\rfloor \quad \text{Eq. (11)}$$

2.2. Largest Lower Bound for k in Equation Eq. (6)

For the present invention according to several embodiments, the proof in this section is analogous to the previous section. The largest the RHS of Eq. (6) is when the smallest value of $F_S$ from Eq. (1) is substituted into Eq. (6). Eq. (6) can then become $$k \geq \frac{n - 1 - \frac{B}{2f_C}}{2 + \frac{B}{f_C}} \quad \text{Eq. (12)}$$

The RHS of Eq. (12) is smallest when $B/f_C$ is largest from Eq. (8). Eq. (12) can then become $$k \geq \frac{n - \frac{3}{2}}{2} \quad \text{Eq. (13)}$$

The RHS of Eq. (12) is largest when $B/f_C = \epsilon$ (where $\epsilon$ is defined above). This makes Eq. (12) simplify to $$k \geq \frac{n - 1 - \frac{\varepsilon}{2}}{2 + \varepsilon} \quad \text{Eq. (14)}$$

Referring again to FIG. 2, the plots of equations Eq. (13) and Eq. (14) can be seen at the bottom graph 24 of FIG. 2 for the smallest integer value of k and $\epsilon = 10^{-12}$. As seen in the figure and can be verified just like the previous section, the smallest integer values of k that satisfy Eq. (13) and Eq. (14) are both equivalent to $\lfloor n/2 \rfloor$. Thus, Eq. (12) also simplifies to Eq. (11), i.e.

$$k \geq \left\lfloor \frac{n}{2} \right\rfloor.$$

2.3. Linear Relationship

Since the two lower bounds of k are always the same for a fixed value of n, the solution to Eq. (4) is $$k_0 = \left\lfloor \frac{n}{2} \right\rfloor \quad \text{Eq. (15)}$$

where n is from Eq. (2). The IF in Eq. (5) can then be rewritten as $$f_{IF} = (-1)^{n+1} \left( -\left\lfloor \frac{n}{2} \right\rfloor F_S + f_C \right) \quad \text{Eq. (16)}$$

Equation (16) illustrates that the IF and $F_S$ can be expressed as a linear relationship, conditioned on n.

Figure 3:
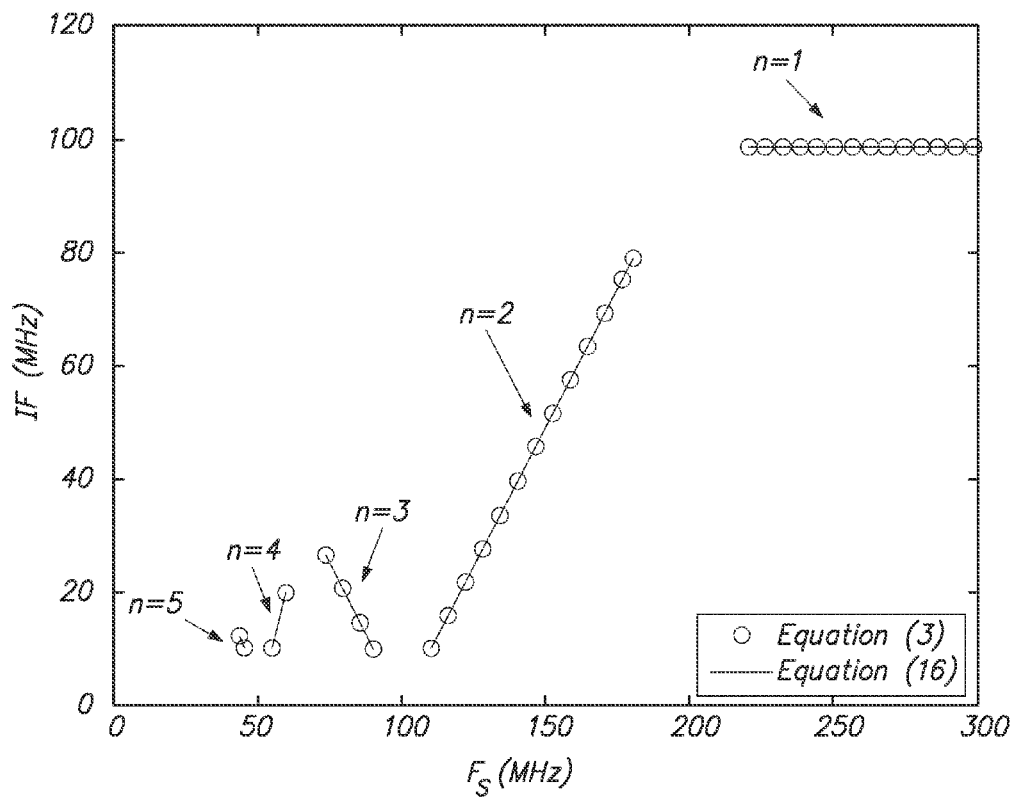
FIG. 3 is a graph of sampling frequency versus intermediate frequency for a signal having a carrier frequency of 100 MHz and a bandwidth of 20 MHz which compares the results of the linear methods of the present invention to the nonlinear methods of the prior art; and, FIG. 4 is a diagram, which illustrates steps that can be taken to practice the methods of the present invention according to several embodiments.

Referring now to FIG. 3, FIG. 3 illustrates a visual comparison of the nonlinear Eq. (3) of the prior art, and the linear Eq. (16), which is used in the systems and methods of the present invention. More specifically, FIG. 3 graphs Eq. (3) and Eq. (16) for the case when $f_C=100$ MHz and B=20 MHz. As can be seen in FIG. 3, the linear relationship in Eq. (16) agrees well with non-linear relationship in the prior art, as described in Eq. (3). Due to the linearity of Eq. (16), it can be used in any case that the nonlinear Eq. (3) is used, plus additional cases. If the sampling frequency is the most important design parameter and the IF does not matter, then one can: Use Eq. (1) to select a valid $F_S$, and in so doing, determine n at the same time; and, Use Eq. (16) to determine the IF.

Figure 4:
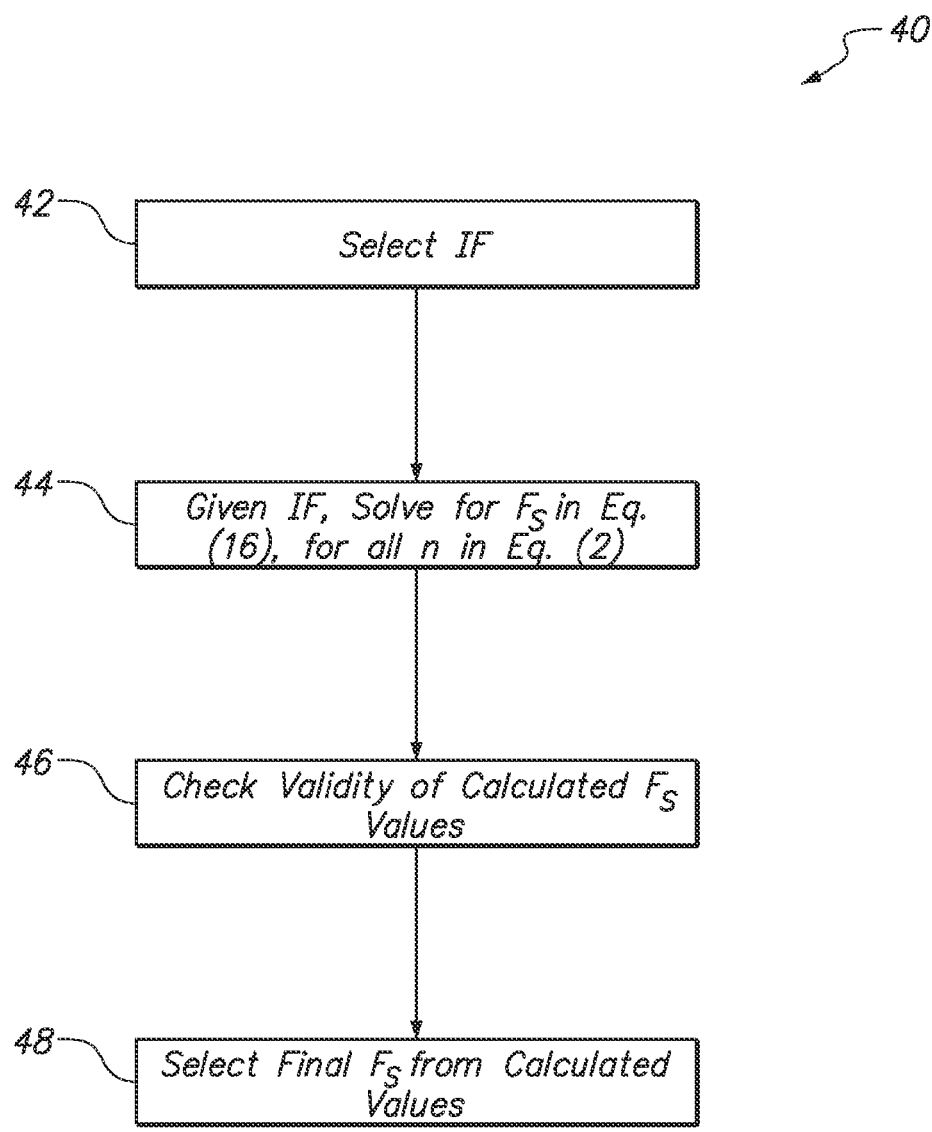

However, if the IF is an important design parameter, and referring now to method 40 in FIG. 4, if there is flexibility in selecting the sampling frequency, then one can: 1) Select the $f_{IF}$ to be used in Eq. (16), as shown by step 42, and then solve for $F_S$ for all values of n in Eq. (2), as shown by box 44; 2) Check which values of $F_S$ can be valid using Eq. (1), box 46; and, 3) Select a particular $F_S$ that meets other design parameters, such as ADC sampling capabilities, as illustrated by box 48 in FIG. 4. Some applications where the IF can be an important design parameter and Eq. (16) would be useful can be discussed below.

3. Applications 3.1 Digital Down Conversion of a Signal

For the methods of the present invention, an application where the IF can be important (the primary design parameter) when using bandpass sampling can be digital down conversion (DDC). This can be because the complexity of the DDC design can be reduced if both the IF and sampling frequency can be chosen carefully. In the prior art, a digital receiver has been presented where the IF was chosen to be $F_S/4$. By doing so, the discrete-time cosine and sine functions that can be used to shift the real IF signal to complex baseband become [1, 0, −1, 0, . . . ] and [0, −1, 0, 1, . . . ], respectively, i.e., integer numbers. Since Eq. (16) is linear, it can easily be used to find sampling frequencies that place the IF at $F_S/4$ by solving the following equations and checking the validity with Eq. (1):

$$\frac{F_S}{4} = (-1)^{n+1}\left(-\left\lfloor\frac{n}{2}\right\rfloor F_S + f_C\right), \quad \text{Eq. (17)}$$

$$\text{where } n = 1, 2, \ldots, \left\lfloor\frac{f_U}{B}\right\rfloor.$$

Also, Eq. (17) can be used in conjunction with other linear constraints to determine $F_S$, such as requiring $F_S$ to be an integer multiple of the symbol rate (the number of symbol changes to the transmission medium per second using a digitally modulated signal) in digital communications.

3.2. Multiple Signal Reception

The IF can also be of primary importance in applications where bandpass sampling is used to receive multiple signals at different carrier frequencies simultaneously. One such application is carrier aggregation. Carrier aggregation has been proposed in the prior art for LTE-Advanced to increase the data rates of cellular networks, and it allows for the use of up to 5 carriers (each with bandwidths up to 20 MHz) that can be spaced apart in frequency. Bandpass sampling can be used to sample the signals on all (up to 5) carriers simultaneously.

The systems and methods of the present invention according to several embodiments can accomplish carrier aggregation. To do this, it can be necessary to make sure the resulting IF signals do not overlap. For example, assume two carriers need to be received at carrier frequencies $f_{C1}$ and $f_{C2}$, with bandwidths $B_1$ and $B_2$, respectively. Further assume that two potential ranges of sampling frequencies, denoted as $\underline{F}_{S1}$ and $\underline{F}_{S2}$, can be found using Eq. (1) and Eq. (2), where the frequencies in $\underline{F}_{S1}$ can sample the signal at $f_{C1}$ with no aliasing and the frequencies in $\underline{F}_{S2}$ can sample the signal at $f_{C2}$ with no aliasing. Denote the corresponding values of n from Eq. (2) as $n_1$ and $n_2$. If the intersection of $\underline{F}_{S1}$ and $\underline{F}_{S2}$ is not empty, there may be a subset of the intersection that will not result in the 2 IF signals overlapping. Equation Eq. (16) can be used to find the subset of sampling frequencies corresponding to this subset (if it exists) by solving either Eq. (18a) or Eq. (18b):

$$f_{IF1} + \frac{B_1}{2} \le f_{IF2} - \frac{B_2}{2} \quad (18a)$$

$$f_{IF2} + \frac{B_2}{2} \le f_{IF1} - \frac{B_1}{2} \quad (18b)$$

where Eq. (16) can be substituted for $f_{IF1}$ and $f_{IF2}$ with n replaced with $n_1$ and $n_2$, respectively, and $F_S$ is constrained to be in the intersection of $\underline{F}_{S1}$ and $\underline{F}_{S2}$. If a solution is found to (18a) (or (18b)), then the IF signal corresponding to $f_{C1}$ is located at a lower (higher) frequency than the IF signal corresponding to $f_{C2}$. If neither (18a) nor (18b) can be satisfied, then a different range of sampling frequencies needs to be checked. Note that the linearity of Eq. (16) of the methods of the present invention makes (18a) or (18b) straightforward to solve, whereas the nonlinearity of Eq. (3) of the prior art makes these difficult to solve.

The above process described the process for simultaneously sampling two signals with arbitrary carrier frequencies and bandwidths. It should be appreciated, however, that the process could be extended to the carrier aggregation for the aforementioned 5 carriers, or even any number of carriers (each carrier with an arbitrary bandwidth), by comparing each carrier's IF signal to every other carrier's IF signal to ensure that there is no IF overlap (and thus, no aliasing). In this manner, carrier aggregation for N sub-bandwidths can be accomplished more efficiently and with less computational resources than the devices and methods of the prior art.

The above procedure can be applicable to situations where the carrier frequencies of the signals are either static or dynamic. Two commercial technologies where it is applicable are global navigation satellite systems (GNSS) and Long Term Evolution-Advanced (LTE-Advanced). With respect to GNSS, currently there are four GNSS signals: GPS, GLONASS, GALILEO, and COMPASS. GPS and GLONASS are operational, while GALILEO and COMPASS are still under development. Each GNSS can use multiple carrier frequencies, and it can be desirable for a user to receive signals simultaneously from multiple GNSS, thus improving positioning performance since more satellites are available, when compared to a single GNSS. Therefore, the algorithm described for multiple signal reception can be used to sample signals from some or all four types of GNSS simultaneously, despite each type having a different carrier frequency. Stated differently, since positioning signals i.e., global navigation satellite system (GNSS) signals and signals of opportunity (SoOP) which are signals that can be used for position estimation even though these signals were not originally intended for positioning applications. Examples of SoOP can include cellular signals like LTE, WiFi, and an Advanced Television Systems Committee (ATSC)-standard digital television signal. occupy different frequencies, the systems and methods of the present invention can allow a receiver to calculate which sampling frequency to use to sample all of these signals simultaneously with one radio frequency (RF) front end. From this one sampled signal, the receiver can utilize multiple positioning signals to more accurately determine its position.

3.3. Polyphase Downconverters

Just like Eq. (16) can be used to simplify DDC when one signal is received, Eq. (16) can also be used to simplify the DDC of multiple signals. The standard M-path polyphase downconverter channelizer as known in the prior art can be commonly used to efficiently downconvert multiple signals when their carrier frequencies are equally spaced apart and they have equal bandwidths. If the carrier frequencies of the signals can be equal to integer multiples of $F_S/M$ (i.e. the output sampling rate of the M channels of the polyphase channelizer), then all of the signals will be shifted to baseband by the channelizer. If the signals have arbitrary carrier frequencies and bandwidths, a receiver design can be used, which consists of a modified version of the standard M-path polyphase downconverter channelizer followed by additional processing. When bandpass sampling is used in a receiver followed by a polyphase downconverter, the carrier frequencies of the input to the downconverter can be the IFs of the sampled signals.

Figure 5A:
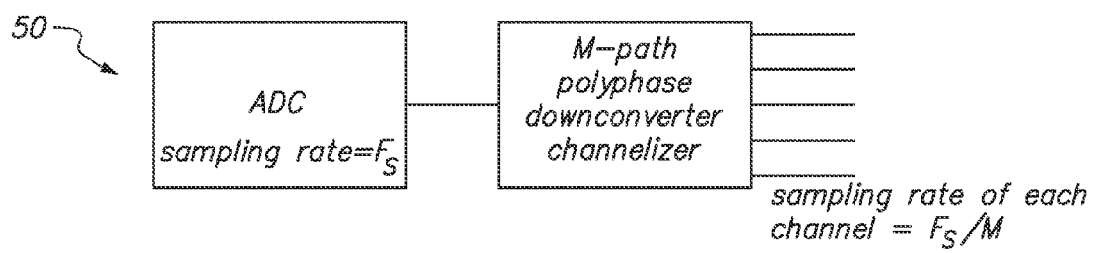
FIG. 5A is a block diagram of a polyphase downconverter channelizer, which can incorporate some of the methods of the present invention according to several embodiments.
Figure 5B:
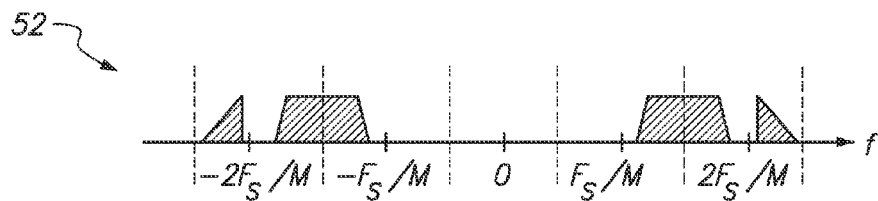
FIG. 5B is a graph in the X(f) frequency domain of intermediate frequency (IF) versus sampling frequency ($F_S$), which illustrates how an IF signal can fall within two separate channels; and, FIG. 5C is a graph in the X(f) frequency domain of intermediate frequency (IF) versus sampling frequency ($F_S$), which illustrates how each IF signal can fall within its own channel, if $F_S$ is chosen correctly according to the methods of the present invention according to several embodiments.
Figure 5C:
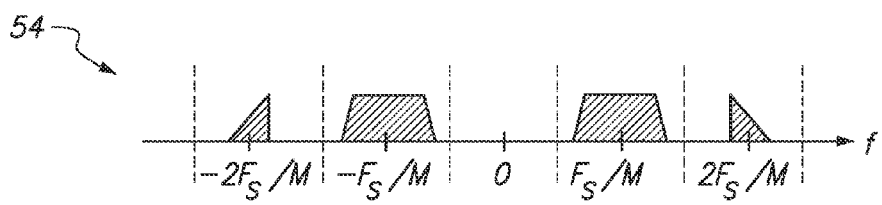

FIG. 5A depicts an example of such a downconverter 50. Graph 52 in FIG. 5B depicts a scenario where the IFs are equal to integer multiples of $F_S/M$ and one of the IF signals falls within two input channels of the downconverter 50 that is shown in FIG. 5A. This scenario can require additional processing after the polyphase downconverter discussed to shift the signals to baseband. However (depending on the particular carrier frequencies and bandwidths of the signals before being sampled by the ADC), it may be possible to select a sampling frequency $F_S$ using the methods of the present invention such that the IF's of the sampled signals can be equal to integer multiples of $F_S/M$, which can result in the scenario depicted in graph 54 as depicted in FIG. 5C. Then, all of the signals will be at baseband at the output of the downconverter 50 and the additional processing that is required in the prior art can be avoided. The linearity of Eq. (16) of the methods of the present invention can be used to accomplish this. More specifically, and as discussed in the previous section, Eq. (16) and Eq. (18) can be used to help find a range of sampling frequencies that do not result in the overlap of the IF signals. Then, similar to Eq. (17), Eq. (16) can be used to select a particular sampling frequency within the range that places some or all of the IF signals either at integer multiples of $F_S/M$ or such that each IF signal falls entirely within an input channel of the downconverter as shown in FIG. 5C.

3.4. Cognitive Radio

With the ongoing research in SDR, cognitive radio, and dynamic spectrum access, a radio may have to receive a signal whose carrier frequency changes over time using bandpass sampling (assuming the radio has a tunable bandpass filter at its RF front end). This may be due to either changes in the environment or due to action taken by the operator. But, no matter what the reasons for a change in carrier frequency, the systems and methods of the present invention can be used to quickly and dynamically determine a sampling frequency that would place the IF at a desired location, such as $F_S/4$, to simplify the DDC process.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" can be to be construed as open-ended terms (i.e., meaning "including, but not limited to,") unless otherwise noted. Recitation of ranges of values herein can be merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention can be described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for analog to digital conversion using bandpass sampling of a continuous analog signal, said method comprising the steps of:
   A) providing a software-defined radio (SDR) including an analog to digital converter (ADC) having a sampling frequency $F_S$;
   B) choosing an intermediate frequency $f_{IF}$;
   C) solving for $$\left\lfloor \frac{f_U}{B} \right\rfloor$$

possible said sampling frequencies using the relationship $$F_S = \frac{(-1)^{n+1} f_{IF} - f_C}{-\left\lfloor \frac{n}{2} \right\rfloor} \quad n = 1, \ldots, \left\lfloor \frac{f_U}{B} \right\rfloor$$

where $f_{IF}$ is said intermediate frequency, $F_S$ is said sampling frequency, $f_C$ is the carrier frequency for said signal, B is the bandwidth of said signal, $f_U$ is the upper frequency defined to be $$f_U = f_C + \frac{B}{2}$$

of said signal, n is an integer such that $$1 \leq n \leq \left\lfloor \frac{f_U}{B} \right\rfloor,$$

and $\lfloor \ \rfloor$ denotes the mathematical floor function;
  D) verifying at least one said $F_S$ from said step C) is valid by checking if each said $F_S$ from said step C) satisfies $$\frac{2f_U}{n} \leq F_S \leq \frac{2f_L}{n-1}$$

where $f_L$ is the lower frequency defined to be $$f_L = f_C - \frac{B}{2}$$

of said signal;
  E) selecting a valid said at least one $F_S$ from said step D) for said bandpass sampling, without iterating $f_{IF}$;
  F) setting said sampling frequency of said ADC, by said SDR, at said at least one $F_S$ from said step E); and
  G) using said ADC to bandpass sample said continuous analog signal.

2. The method of claim 1, wherein said $f_{IF}$ from said step B) is $F_S/4$.

3. The method of claim 1, wherein said signal is a digital communication signal having a symbol rate and said $F_S$ from said step E) is an integer multiple of the symbol rate.

4. A system comprising:
  a software-defined radio (SDR) including an analog to digital converter (ADC) having a sampling frequency $F_S$;
  said ADC using a predetermined intermediate frequency $f_{IF}$;
  said SDR setting said sampling frequency $F_S$ of said ADC, without iteration of said $f_{IF}$, based on the relationship $$f_{IF} = (-1)^{n+1}\left(-\left\lfloor \frac{n}{2} \right\rfloor F_S + f_C\right),$$

where $f_C$ is a carrier frequency and $f_U$ is an upper frequency for said signal, where B is the bandwidth, and where n is an integer such that $$1 \leq n \leq \left\lfloor \frac{f_U}{B} \right\rfloor$$

and $\lfloor \ \rfloor$ denotes the mathematical floor function; and
  said ADC accomplishing analog to digital conversion using bandpass sampling of a continuous analog signal at said sampling frequency $F_S$.

* * * * *